United States Patent
Yasuda et al.

(10) Patent No.: US 8,840,811 B2
(45) Date of Patent: Sep. 23, 2014

(54) ELECTRICALLY CONDUCTIVE BONDING MATERIAL, METHOD OF BONDING WITH THE SAME, AND SEMICONDUCTOR DEVICE BONDED WITH THE SAME

(75) Inventors: Yuusuke Yasuda, Hitachi (JP); Toshiaki Morita, Hitachi (JP); Eiichi Ide, Hitachi (JP); Teiichi Inada, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 700 days.

(21) Appl. No.: 12/768,778

(22) Filed: Apr. 28, 2010

(65) Prior Publication Data

US 2010/0270515 A1    Oct. 28, 2010

(30) Foreign Application Priority Data

Apr. 28, 2009   (JP) ................. 2009-109315

(51) Int. Cl.
*H01B 1/00* (2006.01)
*H01B 1/12* (2006.01)
(Continued)

(52) U.S. Cl.
CPC ....... *B22F 1/0074* (2013.01); *H01L 2224/2919* (2013.01); *H01L 2924/01028* (2013.01); *H01L 2224/48755* (2013.01); *H01L 23/24* (2013.01); *H01L 2924/01045* (2013.01); *H01L 2224/29176* (2013.01); *H01L 2924/13091* (2013.01); *H01L 2224/29157* (2013.01); *H01L 2924/01044* (2013.01); *H01L 2224/8384* (2013.01); *H01L 23/15* (2013.01); *H01L 2224/48855* (2013.01); *H01L 2224/29363* (2013.01);
(Continued)

(58) Field of Classification Search
USPC ........ 228/194; 252/500, 514, 520.3; 419/8, 9; 427/126.5; 516/98
See application file for complete search history.

(56) References Cited

U.S. PATENT DOCUMENTS

| 7,276,185 B2 | 10/2007 | Totokawa et al. |
| 2004/0245648 A1 | 12/2004 | Nagasawa et al. |

(Continued)

FOREIGN PATENT DOCUMENTS

| EP | 1 450 376 | 8/2004 |
| EP | 1 825 940 | 8/2007 |

(Continued)

OTHER PUBLICATIONS

Submission of Information by a third party in a counterpart foreign application of Appln. No. 2009-109315 dated May 31, 2011.

(Continued)

*Primary Examiner* — Bijan Ahvazi
(74) *Attorney, Agent, or Firm* — Antonelli, Terry, Stout & Kraus, LLP.

(57) ABSTRACT

The present invention provides a bonding material and a method of bonding for metal bonding at a bonding interface capable of a higher bonding strength at a lower temperature without application of pressure, compared to a bonding material of metal particles having an average particle size of not greater than 100 nm. An electrically conductive bonding material including (A) silver particles, (B) silver oxide, and (C) a dispersant including organic material containing not more than 30 carbon atoms as essential components, wherein a total amount of (A) the silver powder, (B) the silver oxide powder, and (C) the dispersant including an organic material containing not more than 30 carbon atoms is in a range of 99.0% to 100% by weight, is provided. In other words, no resin binder is contained.

16 Claims, 4 Drawing Sheets

(51) Int. Cl.

| | | |
|---|---|---|
| *H01L 23/15* | (2006.01) | |
| *C22C 1/05* | (2006.01) | |
| *H01L 23/14* | (2006.01) | |
| *H01L 23/373* | (2006.01) | |
| *H01L 23/488* | (2006.01) | |
| *H01L 23/13* | (2006.01) | |
| *H01L 23/498* | (2006.01) | |
| *B22F 1/00* | (2006.01) | |
| *H01L 23/492* | (2006.01) | |
| *H01B 1/22* | (2006.01) | |
| *H01L 25/07* | (2006.01) | |
| *H01L 23/34* | (2006.01) | |
| *B23K 20/00* | (2006.01) | |
| *B23K 28/00* | (2006.01) | |
| *B05D 5/12* | (2006.01) | |
| *H01L 23/24* | (2006.01) | |
| *H01L 21/56* | (2006.01) | |
| *H01L 23/10* | (2006.01) | |
| *H01L 23/00* | (2006.01) | |
| *H01L 23/495* | (2006.01) | |
| *H01L 23/31* | (2006.01) | |
| *H01L 23/049* | (2006.01) | |

(52) U.S. Cl.
CPC ......... *H01L 2924/01019* (2013.01); *H01L 2924/15153* (2013.01); *H01L 2924/01077* (2013.01); *H01L 2224/05655* (2013.01); *H01L 2224/32245* (2013.01); *H01L 2224/73265* (2013.01); *H01L 2224/29339* (2013.01); *H01L 2224/48839* (2013.01); *H01L 2224/29118* (2013.01); *H01L 2224/29294* (2013.01); *H01L 2924/01049* (2013.01); *H01L 2924/01046* (2013.01); *H01L 2224/2936* (2013.01); *H01L 2224/29311* (2013.01); *H01L 2924/01074* (2013.01); *H01L 2224/29166* (2013.01); *H01L 21/565* (2013.01); *H01L 2224/29155* (2013.01); *H01L 2924/01076* (2013.01); *H01L 2224/29173* (2013.01); *H01L 23/10* (2013.01); *H01L 2224/48227* (2013.01); *H01L 2924/01013* (2013.01); *C22C 1/05* (2013.01); *H01L 2224/29357* (2013.01); *H01L 2224/2916* (2013.01); *H01L 2224/2901* (2013.01); *H01L 2924/3511* (2013.01); *H01L 2224/29381* (2013.01); *H01L 2224/29184* (2013.01); *H01L 2224/29111* (2013.01); H01L 23/142 (2013.01); *H01L 2924/19105* (2013.01); *H01L 24/49* (2013.01); *H01L 2224/29181* (2013.01); *H01L 2224/29378* (2013.01); *H01L 2924/0105* (2013.01); H01L 23/3735 (2013.01); *H01L 2224/29355* (2013.01); *H01L 2924/15787* (2013.01); H01L 23/488 (2013.01); *H01L 2924/01014* (2013.01); *H01L 2224/29078* (2013.01); *H01L 2924/01006* (2013.01); *H01L 2224/29101* (2013.01); *H01L 2224/83065* (2013.01); *H01L 2224/29366* (2013.01); *H01L 2924/01033* (2013.01); *H01L 2924/19043* (2013.01); *H01L 2224/29369* (2013.01); *H01L 2924/01047* (2013.01); *H01L 2224/29364* (2013.01); *H01L 2224/29376* (2013.01); *H01L 2224/48472* (2013.01); *H01L 23/49562* (2013.01); *H01L 2224/29171* (2013.01); *H01L 2924/29124* (2013.01); *H01L 2924/01082* (2013.01); *H01L 2224/29373* (2013.01); *H01L 2224/29318* (2013.01); *H01L 2224/2929* (2013.01); *H01L 2224/48739* (2013.01); *H01L 2224/05147* (2013.01); *H01L 2224/29893* (2013.01); *H01L 23/3121* (2013.01); *H01L 2924/19041* (2013.01); *H01L 2924/01029* (2013.01); *H01L 2924/01024* (2013.01); H01L 23/13 (2013.01); *H01L 2224/83075* (2013.01); H01L 24/83 (2013.01); H01L 24/29 (2013.01); *H01L 2224/32505* (2013.01); *H01L 2224/49111* (2013.01); *H01L 2924/0665* (2013.01); *H01L 2224/29139* (2013.01); H01L 23/498 (2013.01); *H01L 2224/29324* (2013.01); *H01L 2924/10253* (2013.01); *H01L 2924/0103* (2013.01); *H01L 2224/29169* (2013.01); *H01L 2224/29178* (2013.01); *H01L 2224/29138* (2013.01); *H01L 2224/45124* (2013.01); *H01L 23/049* (2013.01); *H01L 2224/05639* (2013.01); *H01L 2224/29384* (2013.01); *H01L 2224/29338* (2013.01); *H01L 2924/0132* (2013.01); *H01L 2224/29387* (2013.01); *H01L 2224/29005* (2013.01); H01L 23/49513 (2013.01); *H01L 23/3107* (2013.01); H01L 23/492 (2013.01); H01B 1/22 (2013.01); *H01L 2924/014* (2013.01); *H01L 2224/29309* (2013.01); *H01L 2924/19107* (2013.01); H01L 24/32 (2013.01); *H01L 2224/32225* (2013.01); *H01L 2924/01073* (2013.01); *H01L 2924/01005* (2013.01); *H01L 2924/01078* (2013.01); *H01L 2224/85205* (2013.01); *H01L 2924/09701* (2013.01); *H01L 2224/49175* (2013.01); *H01L 2224/29164* (2013.01); *H01L 2224/48247* (2013.01); H01L 25/072 (2013.01); *H01L 2224/45147* (2013.01); H01L 23/34 (2013.01); *H01L 2224/832* (2013.01); *H01L 2224/29163* (2013.01); *H01L 2224/29109* (2013.01); *H01L 2924/01079* (2013.01); H01L 24/48 (2013.01); *H01L 2224/29371* (2013.01)

USPC ........ 252/500; 228/194; 252/514; 252/520.3; 419/8; 419/9; 427/126.5

(56) References Cited

U.S. PATENT DOCUMENTS

| | | | |
|---|---|---|---|
| 2005/0127536 A1 | 6/2005 | Totokawa et al. | |
| 2007/0224511 A1 | 9/2007 | Totokawa et al. | |
| 2008/0156398 A1 | 7/2008 | Yasuda et al. | |
| 2008/0160183 A1* | 7/2008 | Ide et al. | 427/126.5 |
| 2008/0173398 A1 | 7/2008 | Yasuda et al. | |
| 2009/0236404 A1 | 9/2009 | Yamakawa et al. | |
| 2009/0244868 A1 | 10/2009 | Morita et al. | |

FOREIGN PATENT DOCUMENTS

| | | |
|---|---|---|
| JP | 2003-308730 | 10/2003 |
| JP | 2003-309352 | 10/2003 |
| JP | 2004-107728 | 4/2004 |
| JP | 2005-129303 | 5/2005 |
| JP | 2005-267900 | 9/2005 |
| JP | 2007-042301 | 2/2007 |
| JP | 2008-161907 | 7/2008 |
| JP | 2008-166086 | 7/2008 |
| JP | 2008-178911 | 8/2008 |
| JP | 2009-267374 | 11/2009 |
| KR | 10-2008-0103920 | 11/2008 |
| KR | 10-2008-0107932 | 12/2008 |
| KR | 10-2009-0012281 | 2/2009 |
| WO | WO 2007/034833 A1 | 3/2007 |
| WO | WO 2008/018718 | 2/2008 |
| WO | WO 2008/024625 | 2/2008 |
| WO | WO 2008024625 A1 * | 2/2008 |

OTHER PUBLICATIONS

EP Search Report Appln No. 10004458 dated Dec. 3, 2010 in English.

(56) References Cited

OTHER PUBLICATIONS

Korean Notice of Allowance of Appln. No. 10-2010-38827 dated Mar. 29, 2012.
U.S. Appl. No. 12/696,590, filed Jan. 29, 2010, Ide.
Chinese office action of application 201010171726.3 dated Jun. 5, 2012 with partial English translation.
EP Search Report of Appln. No. 10004458.5 dated May 22, 2012 in English.

* cited by examiner

FIG. 1

Metal bonding at interface

ELECTRICALLY CONDUCTIVE BONDING MATERIAL, METHOD OF BONDING WITH THE SAME, AND SEMICONDUCTOR DEVICE BONDED WITH THE SAME

BACKGROUND OF THE INVENTION

1. Field of the Invention

The present invention relates to an electrically conductive bonding material, a method of bonding with the same, and a semiconductor device bonded with the same. For example, the invention relates to a bonding material and a method of bonding used in a semiconductor module.

2. Background Art

In a non-insulated semiconductor device used in inverters and the like as a power semiconductor device, an anchoring member for attaching a semiconductor element functions as an electrode of the semiconductor device. For example, in a semiconductor device having a power transistor mounted on an anchoring member with a Sn—Pb solder, the anchoring member (base member) is a collector electrode of the power transistor. In operating the semiconductor device, the collector electrode carries an electric current of several or more amperes, resulting in heating the transistor chip. In order to prevent property destabilization or service life reduction due to the heat generation, a good heat dissipation capacity and a long-term reliability (heat resistance) have to be secured in the soldered portion. A material with high heat dissipation is required for securing the heat resistance and heat dissipation performance in a soldered portion.

Similarly, in an insulated semiconductor device, for safe and stable operation of a semiconductor element, developed heat during operating period of a semiconductor device needs to be efficiently dissipated to the exterior of the semiconductor device and reliability of bonding in a soldered portion needs to be secured. For example, in an environment, such as an automotive engine compartment, frequently exposed to high temperatures, the reliability of a bonding portion must be sufficiently high.

Although a bonding material having a high melting point may be used for enhancing heat resistance of a bonding portion, bonding temperature is inevitably raised in this case. A high bonding temperature may cause an anchoring member to get damaged by heat or may cause a warp of an entire semiconductor device due to a difference in stress between a substrate and the anchoring member during a cooling period after bonding. That means heat resistance of a bonding material needs to be enhanced while bonding temperature needs to be lowered.

For example, as described in JP Patent Publication (Kokai) No. 2003-309352, an electrically conductive bonding material which is an electrically conductive composition containing a granular silver compound is known as a bonding material having a high heat dissipation capacity and a high reliability.

In JP Patent Publication (Kokai) No. 2005-129303, a method for sintering particles having sizes in a range of 1 μm to 100 μm in a bonding layer is disclosed.

It is known that a metal particle having a particle size of not greater than 100 nm with few constituent atoms has a sharply increased ratio of surface area to volume of the particle, so that the sintering temperature is substantially reduced compared to that of a bulk form (resulting in increased sintering performance or increased surface energy). For example, JP Patent Publication No. 2004-107728 discloses that metal particles having an average particle size of not greater than 100 nm coated with an organic material are used as bonding material and bonding is performed by sintering the metal particles with each other through decomposition of the organic material by heat, utilizing this low-temperature sintering effect. According to this method of bonding, the metal particles after bonding are transformed into bulk metal and moreover the bonding interface is connected by metal bonding, so that the interface has very high heat resistance and reliability, and a high heat dissipation capacity.

SUMMARY OF THE INVENTION

Unfortunately, heat dissipation capacity and bonding reliability achieved by the bonding materials (electrically conductive adhesives) described in JP Patent Publication (Kokai) No. 2003-309352 and JP Patent Publication (Kokai) No. 2005-129303 are inferior to those achieved by a metal bonded interface, because a resin binder is used for the bonding structure in the former method.

Since the bonding material disclosed in JP Patent Publication No. 2004-107728 is composed of metal particles having an average particle size of not greater than 100 nm, the bonding interface connected by metal bonding has high heat resistance, reliability, and high heat dissipation capacity, as described above. On the other hand, the highly fine metal particles having an average particle size of not greater than 100 nm tend to aggregate. Such metal particles need formation of a protective film composed of an organic material for stabilization. This protective film composed of an organic material needs to be removed when bonding is performed. Since a large amount of organic material volatilizes from the particle surface to cause volume contraction on this occasion, application of pressure is required during bonding. The applied pressure during bonding may cause damage to a semiconductor chip. Since a normal soldering process has no application of pressure, a special process or apparatus for applying pressure during bonding is required for this method, which lacks versatility. As described above, the method of bonding with metal particles having an average particle size of not greater than 100 nm has practical problems in preparing metal particles, removing impurities after preparation, storing, and handling.

The present invention has been made taking such circumstance into consideration and provides an electrically conductive bonding material that has high heat resistance after bonding, enables a metal bonding at a bonding interface at a lower temperature as compared to an electrically conductive bonding materials containing a resin, and enables bonding in the absence of pressure not requiring application of pressure during a bonding process; a bonding method with the same; and a semiconductor device bonded with the same.

In order to solve the problems as described above, in the present invention, a metal bonding in a bonding portion is produced with silver powder (particles) and silver oxide powder (particles) having a particle size of 0.1 μm to 100 μM (micro particles), which have not been taken into consideration heretofore. In the present invention, simplification of a bonding process is achieved by avoiding use of a resin (reducing a content of organic material), thereby allowing elimination of pressure application during the bonding process.

Although use of lead-free solder is preferred, no alternative material is available for high-temperature soldering. Since hierarchical soldering is indispensable in packaging technology, an alternative material for high-temperature soldering is desired. Accordingly, the bonding technology of the present invention is expected to provide the alternative material for high-temperature soldering.

The present inventors found that an electrically conductive bonding material comprising (A) silver powder, (B) silver oxide powder, and (C) a dispersant composed of an organic material containing not more than 30 carbon atoms as essential components, wherein a total amount of the (A) silver powder, the (B) silver oxide powder, and the (C) dispersant composed of an organic material containing not more than 30 carbon atoms is in a range of 99.0% to 100% by weight of the whole electrically conductive bonding material, enables silver particles to start sintering at a low temperature not higher than 200° C. and enables bonding without application of pressure. On this occasion, the blended silver oxide particles are reduced to silver by a redox reaction with the dispersant composed of organic material at a temperature not higher than 150° C. so as to cause fusion, which promotes sintering at a temperature not higher than 200° C. Thus, bonding strength is further improved compared to the case in which silver particles are used alone. In addition, the present inventors found that the silver particles and the silver reduced from the silver oxide used as the bonding material enable bonding to an electrode to be connected without using a resin binder.

The electrically conductive bonding material of the present invention comprises silver particles, silver oxides particles, and a dispersant composed of an organic material containing not more than 30 carbon atoms as essential components, wherein a total amount of the silver particles, the silver oxide particles, and the dispersant is in a range of 99.0% to 100% by weight. The silver particles and the silver oxide particles have particle sizes of 0.1 µm to 100 µm (both inclusive). The silver particles may be in flake form. At least one of the silver particles and the silver oxide particles are coated with a dispersant. Preferably, an amount of the silver oxide particles is not more than an amount of the dispersant. The silver particles and the silver oxide particles are in the ratio of 100 mass parts of the silver particles to 0.01 mass parts to 100 mass parts (both inclusive) of the silver oxide particles.

In another embodiment, the electrically conductive bonding material comprises silver particles, silver oxides particles, a dispersant composed of an organic material containing not more than 30 carbon atoms, and an organic solvent having a boiling point of not higher than 350° C. as essential components, wherein when a total amount of the silver particles, the silver oxide particles, the dispersant, and the organic solvent is 100 mass parts, an amount of the organic solvent is not more than 90 mass parts, and a total amount of the silver particles, the silver oxide particles, the dispersant, and the organic solvent is in a range of 99.0% to 100% by weight in paste form.

In another embodiment, the electrically conductive bonding material comprises silver particles, silver oxides particles, a dispersant composed of organic material containing not more than 30 carbon atoms, and metal particles of other than silver as essential components, wherein the total amount of the silver particles, the silver oxide particles, the dispersant, and the metal particles of other than silver is 99.0% to 100% by weight.

In yet another embodiment, the electrically conductive bonding material comprises silver particles, silver oxides particles, a dispersant composed of an organic material containing not more than 30 carbon atoms, an organic solvent having a boiling point of not higher than 350° C., and metal particles of other than silver as essential components, wherein when a total amount of the silver particles, the silver oxide particles, the dispersant, the organic solvent, the organic solvent, and the metal particles is 100 mass parts, an amount of the organic solvent is not more than 90 mass parts, and a total amount of the silver particles, the silver oxide particles, the dispersant, the organic solvent, and the metal particles of other than silver is in a range of 99.0% to 100% by weight. The bonding material is in paste form.

The semiconductor device of the present invention is bonded by any one of the electrically conductive bonding materials described above, and the bonding portion is composed of a metal part alone with a porosity of higher than 0.1% and lower than 90%.

In the method of bonding of the present invention, any one of the electrically conductive bonding material described above is disposed between an electrode of a semiconductor element and a metal member and sintered by heating in an atmosphere of hydrogen, nitrogen, or argon, so that the electrode of the semiconductor element and the metal member are metal bonded.

The further features of the present invention will be apparent in the description of preferred embodiments of the present invention and the accompanying drawings.

The present invention can provide a bonding material and a method of bonding for enabling a metal bonding at a bonding interface at a lower temperature compared to a bonding material with metal particles having an average particle size of not greater than 100 nm. Since a resin binder is not used, a bonding process without application of pressure can be provided for producing a bonding portion having high heat resistance and high heat dissipation after bonding.

| DESCRIPTION OF SYMBOLS | |
|---|---|
| 201 | Member to be bonded |
| 202 | Ag Flake |
| 203 | $Ag_2O$ |
| 205 | Sintered silver layer |
| 301 | Semiconductor element |
| 302 | Ceramic insulating substrate |
| 302a | Copper plate |
| 303 | Base member |
| 304 | Epoxy resin case |
| 305 | Bonding wire |
| 306 | Epoxy resin lid |
| 307 | Silicone gel resin |
| 308, 309 | Bonding layer |
| 310 | Terminal |

DETAILED DESCRIPTION OF THE PREFERRED EMBODIMENTS

Specific embodiments of the present invention will be now described. Subsequently, Examples and Application Examples will be described.

Composition of the Bonding Material

The present invention relates to an electrically conductive bonding material comprising (A) silver powder, (B) silver oxide powder, and (C) a dispersant composed of an organic material containing not more than 30 carbon atoms as essential components. In an electrically conductive bonding material with such a composition, a total amount of (A) silver powder, (B) silver oxide powder, and (C) the dispersant composed of an organic material containing not more than 30 carbon atoms is in a range of 99.0% to 100% by weight. In other words, a conventional resin is not contained in the composition. During bonding, the electrically conductive bonding material is heated to sinter the silver particles and the silver oxide particles, so that a metal bonding is formed. Blending silver powder with silver oxide gives a dispersant and silver oxide a redox reaction during bonding at a temperature not higher than 150° C. Since the reaction promotes sintering of the silver powder, bonding strength at low temperature can be improved.

Since the bonding mechanism effected by the bonding material of the present invention is based on a metal bonding without a resin, the bonding portion can have high heat resistance and high heat dissipation capacity after bonding. Since such a metal bonding can be produced at a low temperature, the bonding material of the present invention can be applied to, for example, bonding an electrode disposed on an active area of a semiconductor element and a mounting part of an interconnecting substrate for mounting the device. In addition, since the bonding layer after bonding has higher a heat resistance compared to the conventional solder material, no melting problem in a portion mounting a semiconductor element occurs in a thermal process such as secondary packaging. A downsized and highly-reliable semiconductor device can be thereby produced.

Furthermore, the bonding material can substantially improve bonding strength without application of pressure compared to a material of metal nanoparticles having an average particle size of not greater than 100 nm. The metal bonding without application of pressure, which was difficult to achieve by conventional technology, can substantially simplify the bonding process due to omission of the process for application of pressure during bonding. Since no pressure is applied during bonding, damage to a semiconductor chip during bonding can be substantially reduced.

Size and Shape of Particles

The silver particles and the silver oxide particles for use have an average particle size of not smaller than 0.1 μm and not greater than 100 μm. Metal particles having an average particle size of greater than 100 μm have low dispersibility in the electrically conductive bonding material, so that a dense bonding layer cannot be produced. The average particle size is set at not smaller than 0.1 μm, because metal particles having an average particle size of smaller than 0.1 μm need to have their circumference coated with a large amount of organic material in order to prevent the particles from attaching each other in a normal condition and in the cases that such particles are used for bonding, volume contraction occurs while removing the organic material, so that bonding without application of pressure becomes difficult.

Examples of the silver oxide particles include $Ag_2O$ and AgO. A bonding material composed of at least one or two metals may be used. Metal oxides composed of gold oxide and copper oxide may be added concurrently with silver oxide particles for use.

Figure 1:
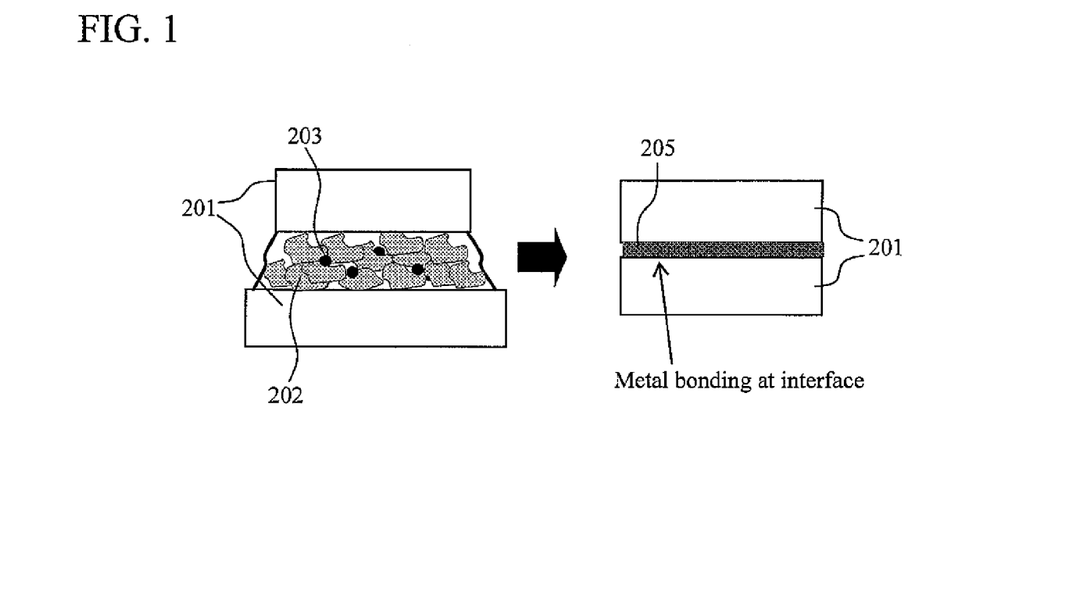
FIG. 1 is a schematic view of a bonding process with silver flakes and silver oxide particles.

The particles of silver oxide and silver for use may be in form of flake. In example to be described, as shown in FIG. 1, silver particles alone is in form of flake. An average particle size of the flake is preferably not greater than 100 μm, more preferably not greater than 50 μm, and most preferably not greater than 10 μm. The preferred lower limit is greater than or equal to 0.1 μm. Flakes having an average particle size of greater than 100 μm may cause clogging in mesh for screen printing or reduce stability of storage paste by sedimentation of the particles in form of flake. Meanwhile, particles in form of flake having an average particle size of smaller than 0.1 μm may not be filled enough due to high viscosity of the paste.

The particles in form of flake have an average thickness of, preferably not greater than 5.0 μm and more preferably not greater than 1 μm. The lower limit is not specifically limited and preferably greater than or equal to 0.1 μm. Flakes having an average thickness of greater than 2.0 μm may have reduced electrical conductivity due to a reduced aspect ratio.

An aspect ratio of the particles in form of flake is preferably greater than 1.0 and more preferably 2 or greater. An upper limit is not specifically determined, preferably not greater than 200, and more preferably not greater than 150.

Shapes of the particles are not limited to a sphere or a flake as described above. A tetrahedron, an octahedron, a rod, and a fiber may be used. Particles in form of flake can make a surface contact each other so as to increase the contact area.

Blending Ratio of Silver Particles to Silver Oxide Particles

Preferably, a blending ratio of silver oxide particles to silver particles is in a range of 0.01 mass parts to 100 mass parts (both inclusive) of silver oxide particles relative to 100 mass parts (% by weight) of silver particles. The blending ratio is set at not smaller than 0.01 mass parts, because the quantities of silver reduced from silver oxide is not enough for the effect of fusing silver at a low temperature with an amount of silver oxide of less than 0.01 mass parts. The blending ratio is set at not greater than 100 mass parts, because the increased portion of volume contraction in a bonding layer causes bonding strength to be reduced with an amount of silver oxide of more than 100 mass parts. Considering bonding strength, a preferred ratio of silver oxide is about 40% by weight (see FIG. 3).

Examples of a Dispersant

Examples of a dispersant (and also reducing agent for silver oxide) composed of an organic material containing not more than 30 carbon atoms include mixtures of at least one constituent selected from alcohols, carboxylic acids, and amines. The mixtures coat the circumference of the blended metal particles with an organic material to improve dispersibility of the particles in an organic solvent. For example, in cases that stearic acid is used as a dispersant for preventing silver particles from attaching to each other, stearic acid is removed from the silver particles by reducing reaction of silver oxide and stearic acid attaching to silver particles at a temperature of 140° C. to 150° C. With an excessive by high blending ratio of silver oxide to stearic acid, silver oxide remains in the bonding material due to the insufficient reducing reaction. In this case, bonding strength is not improved. Consequently, a blending ratio of silver oxide to the dispersant is preferably at most 1:1.

The number of carbon atoms is limited to not more than 30, since an excessive number of carbon atoms cause the boiling point of dispersant to rise and the remaining dispersant in the bonding portion after heating (e.g. 200° C.) during bonding may cause problems in bonding strength and reliability.

Examples of available compounds comprising an alcohol group include alkyl alcohol such as ethanol, propanol, butyl alcohol, pentyl alcohol, hexyl alcohol, heptyl alcohol, octyl alcohol, nonyl alcohol, decyl alcohol, undecyl alcohol, dodecyl alcohol, tridecyl alcohol, tetradecyl alcohol, pentadecyl alcohol, hexadecyl alcohol, heptadecyl alcohol, octadecyl alcohol, nonadecyl alcohol, and icosyl alcohol. In addition, without limitation to primary alcohols, secondary alcohols, tertiary alcohols, alkane diol, or cyclic alcohol compounds may be used. Furthermore, ethylene glycol, triethylene glycol or compounds having many alcohol groups such as citric acid, ascorbic acid, and glucose may be used.

Examples of available compounds containing carboxylic acid include alkylcarboxylic acids such as butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecane acid, icosanoic acid, and oleic acid. Similarly to the alcohol groups as described above, in addition, without limitation to primary alcohols, secondary carboxylic acids, tertiary carboxylic acids, dicarboxylic acids or carboxylic compounds having a cyclic structure may be used.

Furthermore, examples of available compounds containing an amino group include alkylamines such as butylamine, pentylamine, hexylamine, heptylamine, octylamine, nonylamine, decylamine, undecylamine, dodecylamine, tridecylamin, tetradecylamine, pentadecylamine, hexadecylamine, heptadecylamine, octadecylamine, nonadecylamine, and icodecylamine. The compounds having an amino group may have a branching structure. Example of such compounds include 2-ethyl hexylamine and 1,5-dimethylhexylamine. In addition, without limitation to primary amines, secondary amines or tertiary amines may be used. Furthermore, such an organic material may have a cyclic structure.

The dispersants for use are not limited to organic materials including alcohols, carboxylic acids, and amines. Organic materials containing an aldehyde group, an ester group, a sulfanyl group, or a ketone group may be used. Coating here means that functional groups in the organic material is connected with silver or silver oxide to have a role for preventing aggregation. Such a structure is distinguished by infrared spectrometry. In cases that carboxyl acid coats the circumference of silver powder or silver oxide, a carbonyl salt is formed.

According to a spectral analysis by infrared spectrometry of silver with the addition of a dispersant, weak peaks appear in the vicinity of 1520 cm$^{-1}$ and in the vicinity of 1420 cm$^{-1}$. These peaks cannot be observed in cases that a connection with silver is not present. Consequently, an organic material coating the particles can be identified by infrared spectrometry. Determinable organic materials are not limited to carboxyl acid. Any organic materials having functional groups can be identified.

Blending Ratio of Dispersant

An amount of the dispersant for use may be in a range of 0.01 mass parts to 20 mass parts relative to 100 mass parts of a total of silver particles and silver oxide particles. With an amount of dispersant of less than 0.01 mass parts, the low dispersibility of the silver particles and the silver oxide particles causes secondary aggregation, so that uniform application to the bonding portion becomes difficult and bonding without application of pressure is precluded. The amount of the dispersant is set at not more than 20 mass parts, because silver particles are blocked from fusing to each other so that the bonding strength is substantially reduced with an amount of dispersant of more than 20 mass parts.

In an electrically conductive bonding material having silver particles, silver oxide particles, and a dispersant composed of not more than 30 carbon atoms, the total amount of the mixture of these constituents for use is in a range of 99.0% to 100% by weight. The reason for the range is that a resin binder blended in the mixture substantially inhibits sintering between silver particles so as to significantly reduce bonding strength. The limit is set at 99.0%, taking the purity of silver available for use usually into consideration, because silver free of impurities is rare.

Other Compositions

Particles other than silver particles with relatively large particle size having an average particle size of 0.1 μm to 100 μm can be blended in the bonding material for use. The reason for the availability is that the silver particles and the silver oxide particles blended in the electrically conductive bonding material have a function to sinter the other metal particles having an average particle size of 0.1 μm to 100 μm to each other. Examples of such metal particles include gold and copper. Other than the metals described above, at least one metal of, or an alloy of metals of, platinum, palladium, rhodium, osmium, ruthenium, iridium, iron, tin, zinc, cobalt, nickel, chrome, titanium, tantalum, tungsten, indium, silicon, aluminum can be used.

Alternatively, metal particles having an average particle size of not greater than 100 nm may be blended in advance in the bonding material. Metal species for such particles include gold, silver, and copper or oxides of these metals, i.e. gold oxide, silver oxide, and copper oxide. Other than the metals described above, at least one metal of, or an alloy of metals of, platinum, palladium, rhodium, osmium, ruthenium, iridium, iron, tin, zinc, cobalt, nickel, chrome, titanium, tantalum, tungsten, indium, silicon, aluminum can be used. These may be blended for use in a range not to substantially degrade the properties of the electrically conductive bonding material of the present invention.

In cases that other metals are blended in the bonding material, however, a resin is not allowed to be contained due to the reason as described above.

Bonding Material in Paste Form

Although the electrically conductive bonding material for use in the present embodiment may be composed only of silver particles, silver oxide particles, and a dispersant (plus other metal particles), a solvent having a boiling point of not higher than 350° C. may be added for use of the bonding material in paste form. Examples of such a solvent include alcohols. The upper limit of a boiling temperature is set at not higher than 350° C., because a solvent having an excessively high boiling point needs long time for evaporation during bonding at a target temperature of 200° C. to 250° C. and the limit of 350° C. is therefore considered appropriate. Organic materials such as alcohols having a boiling point of higher than 350° C. are not definitely unsuitable, however. Such organic materials may be used depending on intended application.

Examples of available organic materials containing an alcohol group include methanol, ethanol, propanol, butyl alcohol, pentyl alcohol, hexyl alcohol, heptyl alcohol, octyl alcohol, nonyl alcohol, decyl alcohol, undecyl alcohol, dodecyl alcohol, tridecyl alcohol, tetradecyl alcohol, pentadecyl alcohol, hexadecyl alcohol, heptadecyl alcohol, octadecyl alcohol, nonadecyl alcohol, and icocyl alcohol. In addition, glycols such as diethylene glycol, ethylene glycol, and triethylene glycol can be used. In addition, without limitation to primary alcohols, secondary alcohols, tertiary alcohols, alkanediol, or cyclic alcohol compounds may be used. Alternatively, terpineol, ethylene glycol, triethylene glycol or compounds having many alcohol groups such as citric acid, ascorbic acid, and glucose may be used. The preferred compound is selected from secondary alcohols or tertiary alcohols. The reason is that primary alcohols blended with silver oxide reduce a portion of the surface of silver oxide to concurrently produce salt and precipitated silver after one day, so that stability of storage silver oxide is reduced. With secondary alcohols or tertiary alcohols, no reaction occurs for producing the salt on the surface of silver oxide, and the stability of storage is excellent. Most preferably, glycol solvent is used due to availability at low price and low toxic potential for human body. Furthermore, since an alcohol solvent may function as not only a solvent but also a reducing agent for silver oxide, the amount can be properly adjusted for reducing a certain amount of silver oxide.

Alternatively, instead of the organic materials having an alcohol group as described above, carboxylic acid, amine, or an organic material having an aldehyde group, an ester group, a sulfanyl group, or a ketone group can be used. Furthermore, toluene or an organic material composed of hydrocarbon alone having no functional group as described above such as hexane and cyclohexane may be used. As described above, an organic solvent having a boiling point of not higher than 350° C. may be used and more than one of such organic solvents may be blended for use. The organic material having a boiling point of not higher than 350° C. is defined here as an organic material which reduces weight by 99 wt % up to 350° C. in nitrogen atmosphere at 10° C./min in measurement with a thermogravity analyzer such as TG/DTA6200 made by Seiko Instruments and TGA-50 made by Shimadzu.

The amount of the organic solvent to be blended may be preferably not higher than 90% by weight, or more preferably not higher than 50% by weight relative to 100% by weight of the electrically conductive bonding material of the present invention. The mixture may be agitated with a mortar, a kneader, a vibratory ball mill, a roller mill, or a planet ball mill.

The electrically conductive bonding material in paste form is applied by various methods. For example, the electrically conductive bonding material is ejected through a fine nozzle for applying to an electrode or a connecting portion of an electronic component by ink jet method; the material is applied only to a necessary part with a metal mask having an aperture corresponding to the part to be coated or a mesh mask; the material is applied to a necessary part with a dispenser; and the material is applied to a water-shedding resin containing silicone or fluorine with a metal mask having an aperture corresponding to the part to be coated or a mesh mask. These methods of application can be combined depending on the area and shape of the electrode to be bonded. Alternatively, pressure is applied on the electrically conductive bonding material to form into sheet for use in bonding.

Heating Conditions

For bonding with the electrically conductive bonding material of the present invention, heating during bonding is indispensable in order to achieve sintering silver particles to each other, reducing silver oxide, and forming a metal bonding with electrode surface. In the preferred heating conditions for the bonding, temperature ranges from 40° C. to 350° C. (both inclusive) during a time period of 1 second to 180 minutes (both inclusive).

With conventional metal particles having an average particle size of not greater than 100 nm, application of pressure is required during bonding since desorption of an organic material causes volume contraction of the metal particles. Meanwhile, in the present invention, a metal bonding at the bonding interface can be achieved without application of pressure. The bonding process can be thereby simplified. However, pressure may be applied if needed for improving the bonding strength.

The reason for the lower limit of heating temperature is that a heating temperature of lower than 40° C. causes insufficient sintering of silver particles and insufficient reduction of silver oxide so that bonding cannot be achieved.

The reason for the upper limit of heating period is that a heating period of longer than 180 minutes makes difficulty in high-volume manufacturing due to the lengthy time required for making one product.

Atmosphere for bonding is not limited to air. Reducing atmosphere such as hydrogen or inert atmosphere such as nitrogen and argon can be used. Bonding in such atmosphere can ease the problem of oxidation of an electronic component in air.

The bonding portion of an semiconductor device bonded with the electrically conductive bonding material of the present invention comprising (A) silver particles, (B) silver oxide, and (C) dispersant composed of an organic material containing not more than 30 carbon atoms as essential components, a total amount of (A) silver powder, (B) silver oxide powder, and (C) dispersant composed of an organic material containing not more than 30 carbon atoms being in a range of 99.0% to 100% by weight, is formed with the particles having shapes remaining intact, since no pressure is applied during bonding.

Consequently, a void is inevitably present in the bonding layer. In a cross-sectional view of the bonding layer, the porosity (i.e. void area divided by bonding layer area) is in a range of 0.1% to 99.9%. The preferable porosity is not higher than 90%. Due to the presence of voids, the bonding layer has a lower density and a lower elastic modulus compared to a bonding layer of bulk silver. As a result, stress loading to a chip is reduced, so that long-term reliability of the bonding portion is improved.

EXAMPLES

Examples and applications will be described below with reference to attached drawings.

Example 1

In Example 1, 0.9 g of silver flakes having an average particle size of about 1 μM, an average thickness of about 0.5 μM, and an aspect ratio of about 2.0, coated with 1.0 wt % stearic acid, 0.1 g of silver oxide ($Ag_2O$) particles having an average particle size of about 2 μm, and 0.2 g of ethanol (made by Wako Pure Chemical Industries) as an organic solvent were used. These were blended with a mortar for about one hour to make an electrically conductive bonding material.

As Comparative Example 1, a conventional silver paste which is available in the market was used. As Comparative Example 2, an electrically conductive bonding material was made by blending 100 mass parts of silver flakes having an average particle size of about 1 μm, an average thickness of about 0.3 μm, and an aspect ratio of about 2.0, coated with 1.0 wt % stearic acid, into 20 mass parts of ethanol with a mortar for about 10 minutes.

Subsequently, after bonding was performed with the electrically conductive bonding materials of Example 1 and Comparative Examples 1 and 2, strength in shear was measured. The topside and downside test specimens for the measurement have a diameter of 5 mm and a thickness of 2 mm, and a diameter of 10 mm and a thickness of 5 mm, respectively. The surface of the specimens was plated with Ag. After the electrically conductive bonding materials of Example 1 and Comparative Examples 1 and 2 were applied onto the respective downside specimens, the respective topside specimens were disposed on the bonding material to heat at 200° C. for bonding. The heating time was 5, 15, 30, and 60 minutes as shown in Table 1.

TABLE 1

| | Relative bonding strength | | | | |
|---|---|---|---|---|---|
| Bonding time (min) | Example 1 | Comparative Example 1 | Comparative Example 2 | Comparative Example 3 | Comparative Example 4 |
| 15 | 1.4 | 0.2 | 0.0 | 0.2 | 0.1 |
| 30 | 2.3 | 0.6 | 0.5 | 0.3 | 0.2 |
| 60 | 2.0 | 1.5 | 1.0 | 0.5 | 0.4 |

As shown in FIG. 1, particles of the electrically conductive bonding material disposed between members 201 to be bonded are sintered to each other by heating, so that a sintered silver layer 205 is formed. On this occasion, a metal bonding is achieved at the bonding interface between the sintered silver layer 205 and the bonded member 201. Subsequently, bonding strength of the specimens bonded with the bonding material was measured under pure shear stress conditions. For the shearing test, a bond tester SS-100 KP (maximum load of 100 kg) made by Seishin Trading was used. At a shearing speed of 30 mm/min, the specimen was fractured with a shearing tool to measure the maximum load at fracture. The maximum load divided by the bonding area was defined as shearing strength.

Figure 2:
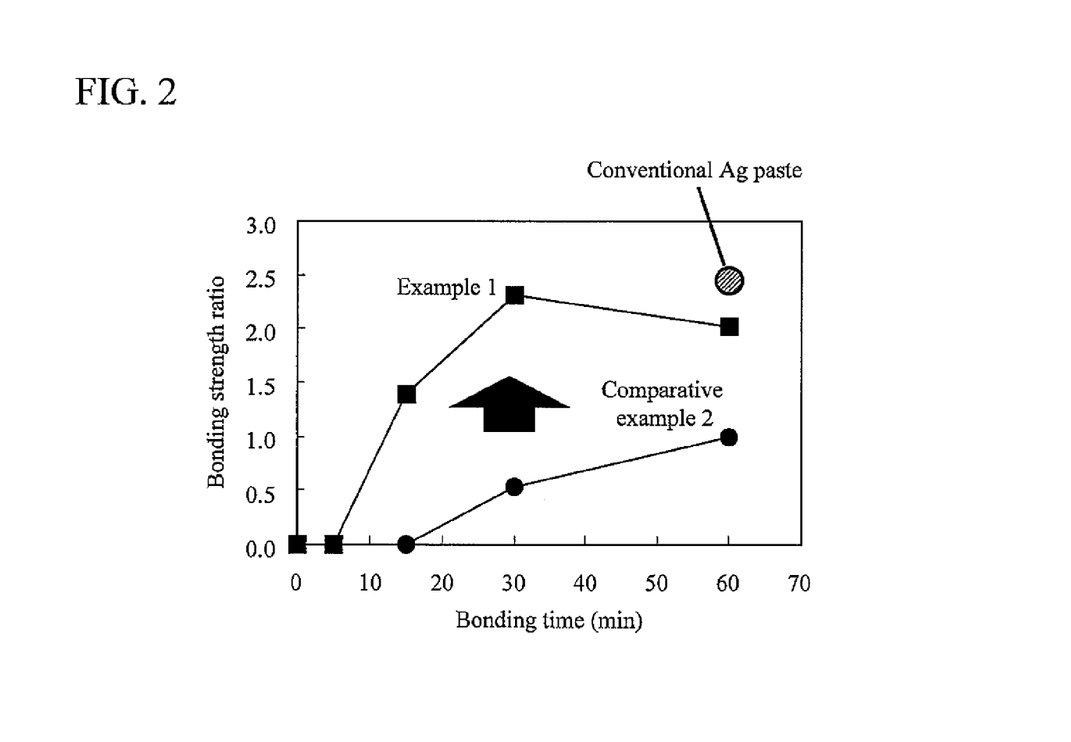
FIG. 2 is a graph showing changes in bonding strength induced by adding silver oxide particles to silver flakes.

The test results of the shearing strength for the bonding materials of Example 1 and Comparative Examples 1 and 2 are shown in FIG. 2. Each bonding strength was represented as a relative ratio to the bonding strength of the specimen of Comparative Example 2 which was heated at 200° C. for 60 minutes without application of pressure. The bonding strength ratio of Comparative Example 2, of which electrically conductive bonding material was made by blending 100 mass parts of silver flakes having an average particle size of about 1 μm, an average thickness of about 0.3 μm, and an aspect ratio of about 2.0, coated with 1.0 wt % stearic acid, into 20 mass parts of ethanol with a mortar for about 10 minutes, was low. On the other hand, the bonding strength ratio of Example 1, of which electrically conductive bonding material was made by blending 0.9 g of silver flakes having an average particle size of about 1 μm, an average thickness of about 0.5 μm, and an aspect ratio of about 2.0, coated with 1.0 wt % stearic acid, 0.1 g of silver oxide ($Ag_2O$) particles having an average particle size of about 2 μm, and 0.2 g of ethanol (made by Wako Pure Chemical Industries) as an organic solvent with a mortar for about one hour, was substantially improved. A relative strength ratio of 2.0 is achieved in the case of heating for 60 minutes. The advantageous effect of blending silver oxide into silver flakes on substantially improving bonding strength was thereby confirmed.

Then, Example 1 was compared to Comparative Examples 3 and 4. In Comparative Example 3, nano-sized silver particles coated with octylamine disclosed in Japanese Patent Publication (Kokai) No. 2008-161907 were used. In Comparative Example 4, a blended bonding material of silver oxide particles and myristyl alcohol disclosed in JP Patent Publication (Kokai) No. 2008-178911 was made. In Comparative Example 5, a bonding material was made by blending silver oxide ($Ag_2O$) particles and myristyl alcohol in a ratio of 9 to 1 by weight and by braying the mixture with a mortar. A bonding strength test was made for these materials. The topside and downside test specimens for the measurement have a diameter of 5 mm and a thickness of 2 mm, and a diameter of 10 mm and a thickness of 5 mm, respectively. The surface of the specimens was plated with Ag. After the electrically conductive bonding materials of Comparative Examples 3 and 4 were applied onto the respective downside specimens, topside specimens were disposed on the respective bonding materials to heat at 200° C. for bonding. Bonding strength was measured for the bonding portion which was only sheared. For the shearing test, a bond tester SS-100 KP (maximum load of 100 kg) made by Seishin Trading was used. At a shearing speed of 30 mm/min, the specimen was fractured with a shearing tool to measure the maximum load at fracture. The maximum load divided by the bonding area was defined as shearing strength. As shown in Table 1, comparisons were made based on the bonding strength ratio. With reference to Table 1, the electrically conductive bonding material of the present invention has a substantially improved bonding strength compared to the materials based on conventional bonding technology for achieving a metal bonding. It is understood that the electrically conductive bonding material of the present invention has excellent properties.

Example 2

In Example 2, silver flakes having an average particle size of about 1 μm, an average thickness of about 0.5 μm, and an aspect ratio of about 2.0 were used. The specimens composed of silver flakes coated with 1.0 wt % stearic acid and silver oxide ($Ag_2O$) particles having an average particle size of about 2 μm in a different blended ratio by weight of 95 to 5, 90 to 10, 80 to 20, or 50 to 50 were made. Furthermore, 100 mass parts of the specimens were blended into 20 mass parts of ethanol (made by Wako Pure Chemical Industries) as an organic solvent with a mortar for about 1 hour to make 1 g of the electrically conductive bonding materials, respectively. Subsequently, strength in shear was measured. The topside and downside test specimens for the measurement have a diameter of 5 mm and a thickness of 2 mm, and a diameter of 10 mm and a thickness of 5 mm, respectively. The surface of the specimens was plated with Ag. After the electrically conductive bonding materials of Example 1 and Comparative Examples 1 and 2 were applied onto the respective downside specimens, topside specimens were disposed on the bonding material to heat at 200° C. for bonding. The heating time was 60 minutes. Each strength was represented as a relative ratio to the bonding strength of the specimen of Comparative Example 2 which was heated at 200° C. for 60 minutes without application of pressure.

Figure 3:
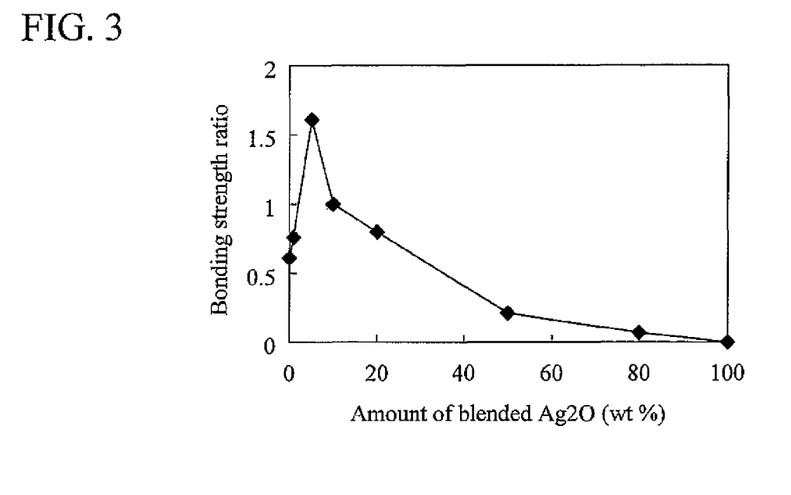
FIG. 3 is a graph showing an effect of a proportion of the silver oxide added to the silver flakes.

As shown in FIG. 3, the highest bonding strength was achieved in the case of a mixture having 5 wt % silver oxide ($Ag_2O$) particles. The reason is that the proportion of stearic acid and silver oxide particles was most suitable for the redox. With excessive silver oxide, silver oxide remains, and with insufficient silver oxide, organic material remains in the circumference of silver particles. In these cases, the substantial improvement in bonding strength is not achieved.

Subsequently, the results of thermal conductivity measurement of Example 2, Comparative Examples 1 to 4 were compared. The thermal conductivity is defined by equation (1).

$$\text{Thermal conductivity (W/mK)} = \text{Thermal diffusivity (m}^2\text{/s)} \times \text{Specific heat (J/g·K)} \times \text{Density (g/cm}^3\text{)} \quad (1)$$

Thermal diffusivity (m²/s), density (g/cm³), and specific heat (J/g·K), which are required to calculate the thermal conductivity, were measured with apparatus as described below. Thermal diffusivity was measured for specimens having a shape of 5 mm by 10 mm by 0.1 μm with PIT1 made by ULVAC SINKU-RIKO. Density was measured with SD-200L made by Alfa Mirage. Specific heat was measured with Q2000 made by TA Instrument. The thermal conductivity was calculated from these measured data. The results are shown in Table 2.

Each value represented in Table 2 is a relative ratio to the thermal conductivity of the specimen of Comparative Example 2 which was heated at 200° C. for 60 minutes without application of pressure. Comparative Examples 1, 3 and 4 have lower thermal conductivities compared to Comparative Example 2. The results also correspond to the bonding strength. The reasons are that Comparative Example 1 contains a resin having a low thermal conductivity, and each of Comparative Examples 3 and 4 has a low density without application of pressure. On the other hand, Example 2 using the specimen having a blending ratio of silver flakes to silver oxide by weight of 90 to 10 had a higher thermal conductivity compared to Comparative Example 2. This resulted from more progressive sintering of the film formed at the same temperature, since the sintering temperature was reduced by blending silver oxide. As described above, the bonding material of Example 2 has advantages not only in bonding strength, but also in thermal conductivity.

TABLE 2

| Heating time (min) | Relative thermal conductivity | | | | |
| --- | --- | --- | --- | --- | --- |
| | Example 2 | Comparative Example 1 | Comparative Example 2 | Comparative Example 3 | Comparative Example 4 |
| 60 | 1.5 | 0.3 | 1.0 | 0.2 | 0.6 |

Application Example 1

Figure 4:
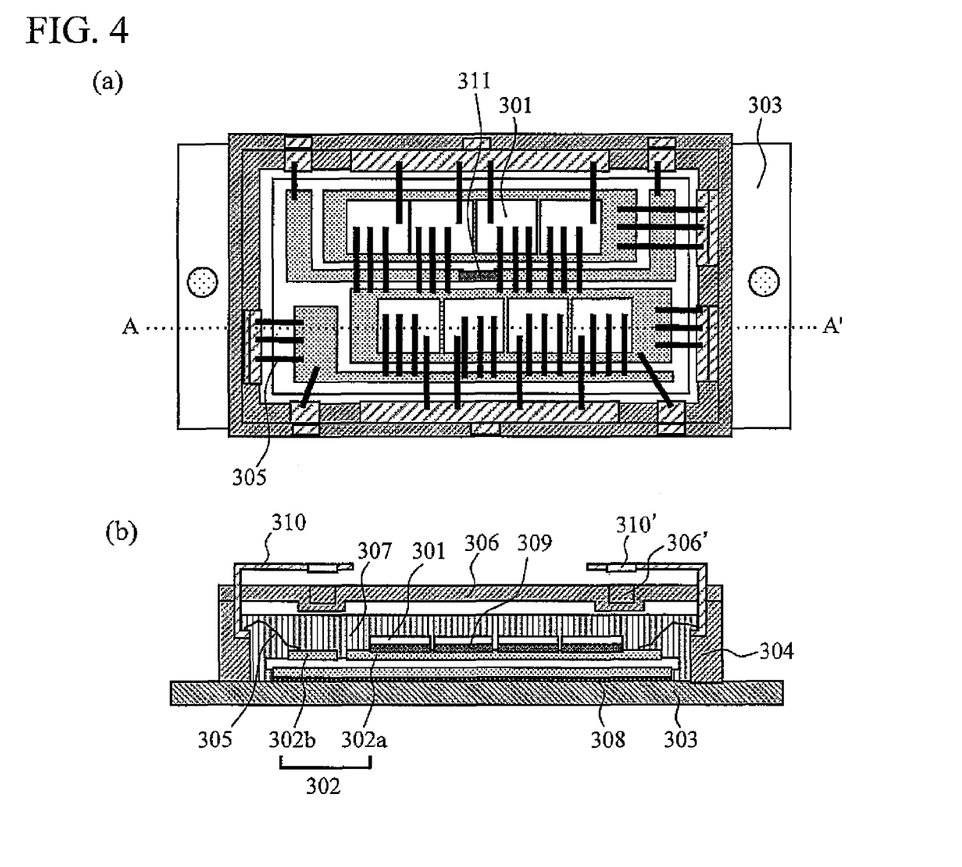
FIG. 4 shows a structure of a non-insulated semiconductor device of an example of the present invention.

FIG. 4 shows a structure of a non-insulated semiconductor device of an Application Example of the present invention. FIG. 4 (A) is a top view and FIG. 4 (B) is a cross-sectional view, taken along the line A-A' in FIG. 4 (A). After a semiconductor element (MOSFET) 301 and a ceramic insulating substrate 302 are mounted on the ceramic insulating substrate 302 and a base member 303, respectively, an epoxy resin case 304, a bonding wire 305, and an epoxy resin lid 306 were disposed where the case was filled with silicone gel resin 307. The ceramic insulating substrate 302 on the base member 303 is bonded with a bonding layer 308 composed of the electrically conductive bonding material of Example 1, and the eight MOSFET elements 301 of Si on a copper plate 302a of the ceramic insulating substrate 302 is bonded with a bonding layer 309 composed of the electrically conductive bonding material of Example 1. For bonding with the bonding layers 308 and 309, the electrically conductive bonding material of Example 1 is initially applied onto the Ni-plated copper plate 302a of the ceramic insulating substrate 302 and the base member 303, respectively.

Then, the semiconductor element 301 and the ceramic insulating substrate 302 are disposed on the electrically conductive bonding material of Example 1 for connection. Bonding was performed by heating at about 150° C. for 120 minutes in the air.

A gate electrode, a emitter electrode and the like formed on each element 301 were wire-bonded by ultrasonic bonding to electrodes 302a and 302b formed on the insulating substrate and a terminal 310 previously attached to the epoxy resin case 304 with an Al wire 305 having a diameter of 300 μm. A thermistor element 311 for detecting temperature is composed of the bonding layer 309 bonded with the electrically conductive bonding material of Example 1 and electrode 302b is wire-bonded to the terminal 310 with the Al wire 305 having a diameter of 300 μm to connect with an exterior.

Epoxy resin case 304 and base member 303 were fixed to each other with a silicone adhesive resin, which is not shown in the attached drawings. The epoxy resin lid 306 has pits 306' in fleshy portions and the terminal 310 has a hole 310' so that a screw (not shown in the attached drawings) for connecting an insulated semiconductor device 1000 with an external circuit can be mounted. The terminal 310, which is formed by punching a copper plate in a predetermined shape and then Ni-plated, is attached to the epoxy resin case 304.

Figure 5:
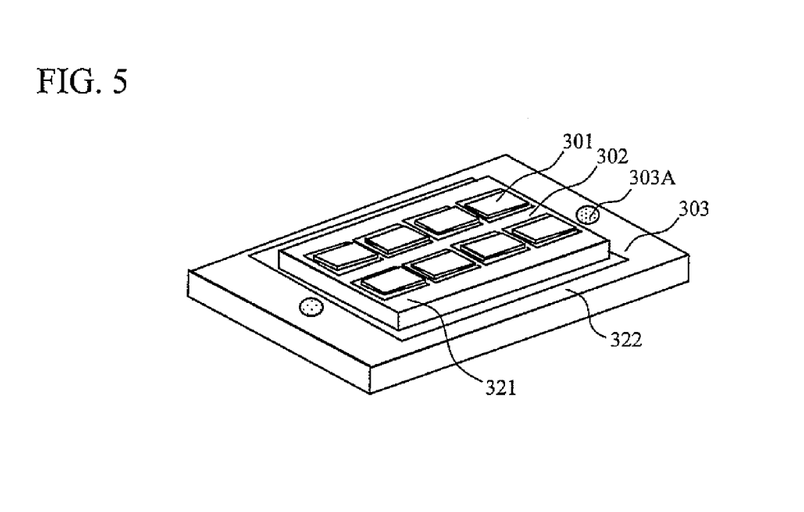
FIG. 5 shows a subassembly of an insulated semiconductor device of the present invention.

FIG. 5 shows a subassembly of an insulated semiconductor device shown in FIG. 4. In the insulated semiconductor device, the ceramic substrate and the semiconductor element are mounted on the composite 303 as a base member. A mounting hole 303A is disposed in the circumference of the base member. The base member is composed of Cu. The surface of the base member is Ni-plated. The ceramic insulated substrate 302 is mounted on the base member 303 with the bonding layer bonded with the electrically conductive bonding material of Example 1. Similarly, the MOSFET element 301 is mounted on the ceramic insulated substrate 302 with the bonding layer bonded with the electrically conductive bonding material of Example 1. On this occasion, bonding is performed in a thermostatic chamber heated at 250° C. for 60 minutes in the air.

Figure 6:
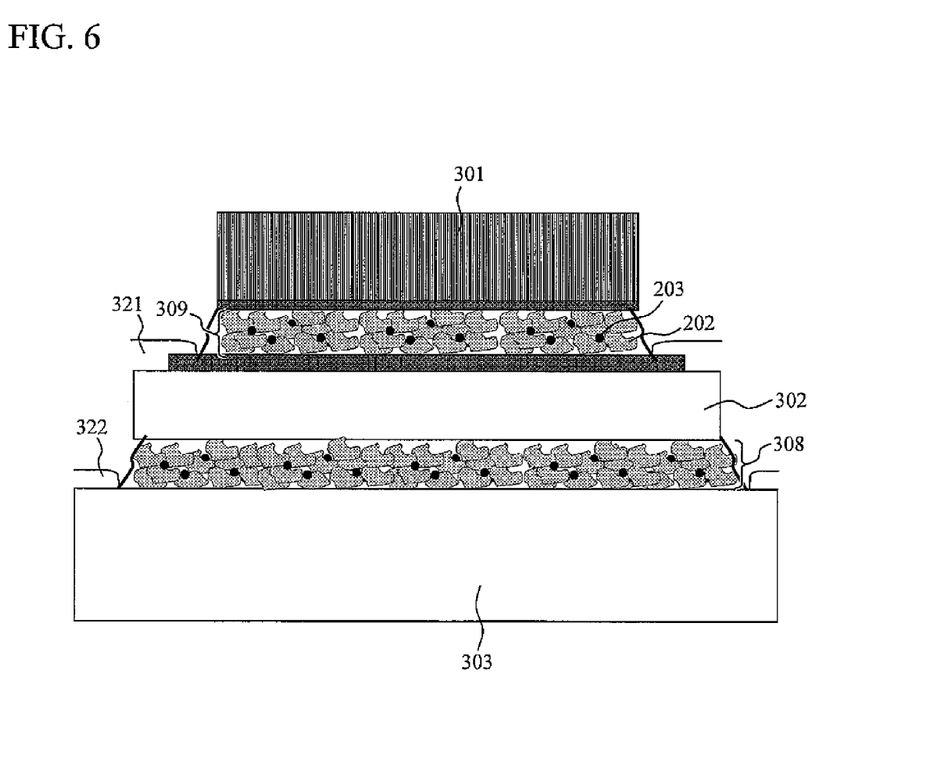
FIG. 6 is an enlarged schematic view of a bonding part of a semiconductor element and a substrate.

FIG. 6 is an enlarged schematic cross-sectional view of a mounting part of the MOSFET element in FIG. 5 before bonding. As shown in FIG. 6, the electrically conductive bonding material of Example 1 can be used in the bonding layer. In order to prevent the applied solution of electrically conductive bonding material of Example 1 from flowing outward, a water-shedding film 322 is applied on the base member 303 corresponding to the region of mounting the ceramic insulating substrate 302. In addition, a water-shedding film 321 is applied on the ceramic insulating substrate 302 corresponding to the region of mounting the semiconductor element 301 so that the applied paste is prevented from flowing outward.

Application Example 2

Application Example 2 relates to an insulated semiconductor device as a high-frequency power amplifier device used in a transmitter for a cellular phone and the like. The structure of the insulated semiconductor device having a size of 10.5 mm by 4 mm by 1.3 mm is given as follows.

Figure 7:
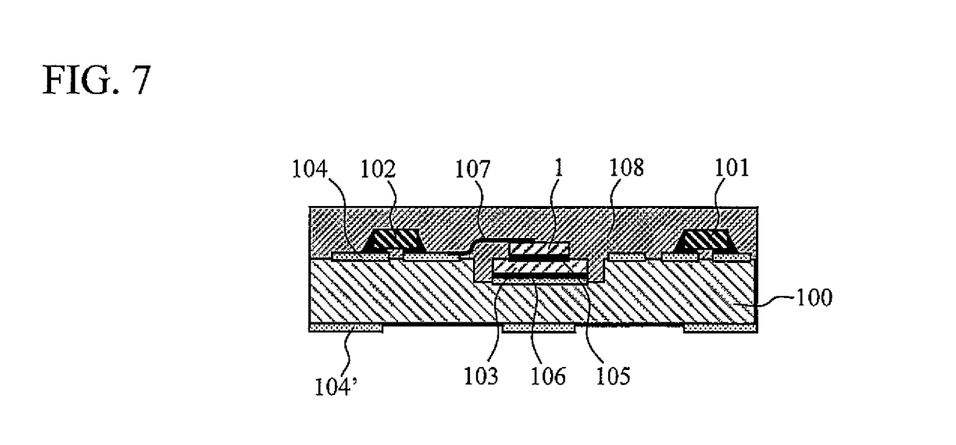
FIG. 7 is a cross-sectional schematic view of an insulated semiconductor device of the example.

FIG. 7 is a schematic cross-sectional view of the insulated semiconductor device of Application Example 2. Chip parts including a MOSFET element 1 having a size of 2.4 mm by 1.8 mm by 0.24 nun, a chip resistor 101 (about 7 ppm/° C.), and a chip capacitor 102 (about 11.5 ppm/° C.) are mounted on a multi-layer glass ceramic substrate having a size of 10.5 mm by 4 mm by 0.5 mm, a 3-layer interconnection, a coefficient of thermal expansion of 6.2 ppm/° C., a thermal conductivity of 2.5 W/m·K, a bending strength of 0.25 GPa, a Young's modulus of 110 GPa, and a permittivity of 5.6 (1 MHz), as a base member 100.

An intermediate metal member 103 composed of for example, Cu—Cu$_2$O composite is disposed between the MOSFET element 1 and the multi-layer glass ceramic substrate 100. A thick film internal interconnecting layer (Ag-1 wt % Pt, a thickness of 15 μm), a thick film through-hole conductor (Ag-1 wt % Pt, a diameter of 140 μm) for an electrical connection between the multi-layer interconnections, and a thick film thermal via (Ag-1 wt % Pt, a diameter of 140 μm) for heat dissipation path are disposed in the multi layer glass ceramic substrate 100.

A thick film interconnecting pattern 104 (Ag-1 wt % Pt, a thickness of 15 μm) is also disposed on a main plane of the multi layer glass ceramic substrate 100. Chip parts including the chip resistor 101 and the chip capacitor 102 are mounted on this thick film interconnecting pattern 104. Initially, the electrically conductive bonding material of Example 1 is prepared by blending the equivalent amount of decanol as the organic solvent instead of ethanol with a mortar for 10 minutes to form a paste. Then, the paste is applied onto the thick film interconnecting pattern. By heating the paste at 200° C. for 30 minutes in a thermostatic chamber substituted by hydrogen, a sintered silver layer 105 for electrically conductive bonding of the chip parts is formed.

The MOSFET element (Si, 3.5 ppm/° C.) 1 is mounted in a recess disposed on a main plane of the multi layer glass ceramic substrate 100 through an intermediate metal member 103. The mounting was performed in vacuum of $10^{-3}$. The intermediate metal member 103 has a size of 2.8 mm by 2.2 mm by 0.2 mm. Both of the sintered silver layer 105 for connecting the MOSFET element 1 and the intermediate metal member 103, and the bonding layer 106 for connecting the intermediate metal member 103 and the multi layer glass ceramic substrate 100, are bonded layers made from the electrically conductive bonding material of Example 1 in paste form prepared by blending the equivalent amount of decanol as the organic solvent instead of ethanol with a mortar for 10 minutes to form the paste. A clip-type connecting terminal 107 composed of Cu is bonded with the electrically conductive bonding material of Example 1 for connecting a MOSFET element 1 and a predetermined portion of the thin film interconnecting pattern 104. On this occasion, the bonding was performed by heating at 200° C. for 30 minutes in a thermostatic chamber substituted by hydrogen. On another main plane of the multi layer glass ceramic substrate 100, a thick film external electrode layer 104' (Ag-1 wt % Pt, a thickness of 15 μm) is disposed. The thick film external electrode layer 104' is electrically connected with the thick film interconnecting pattern 104 through an internal interconnecting layer and a through-hole interconnection disposed in the multi layer glass ceramic substrate 100. On a main plane of the multi layer glass ceramic substrate 100, an epoxy resin layer 108 is disposed to seal the mounted chip parts.

Application Example 3

Application Example 3 relates to a non-insulated semiconductor device in which a composite is applied as a lead frame of a mini-mold type transistor.

Figure 8:
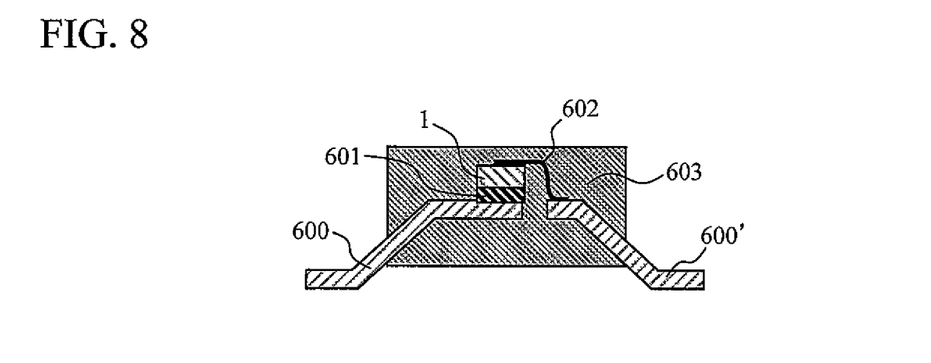
FIG. 8 is a cross-sectional schematic view of a mini-mold type non-insulated semiconductor device of the example.

FIG. 8 is a cross-sectional schematic view of a mini-mold type non-insulated semiconductor device of Application 3. A transistor element having a size of 1 mm by 1 mm by 0.3 mm composed of Si as a semiconductor element 1 is bonded with a sintered silver layer 601 by applying the electrically conductive bonding material of Example 1 on a lead frame 600 having a thickness of 0.3 mm composed of, for example, a composite of Cu—$Cu_2O$ and by heating at 200° C. for 60 minutes in a thermostatic chamber substituted by nitrogen. A collector of the transistor element 1 is also disposed on the side bonded with the electrically conductive bonding material of Example 1. An emitter and a base are disposed on the opposite side of the side bonded with the electrically conductive bonding material of Example 1 and bonded to a clip type terminal 602 derived from the transistor element 1 with the electrically conductive bonded material applied to the lead frame 600 by heating in the same way at 200° C. for 60 minutes in a thermostatic chamber substituted by nitrogen. The main portion of the mounted transistor element 1 with the clip type terminal 602 is covered with an epoxy resin 603 by transfer molding. The lead frame 600 is cut off after completion of molding of the epoxy resin 603 for functioning as individual terminals.

Other Application Examples

In the case of mounting of an LED on a substrate, higher heat dissipation can be achieved by bonding with the electrically conductive bonding material of the present invention compared to conventional soldering or bonding with an electrically conductive adhesive of Ag paste.

What is claimed is:

1. An electrically conductive bonding material comprising silver particles, silver oxides particles, and a dispersant comprising an organic material containing not more than 30 carbon atoms as essential components, wherein a total amount of the silver particles, the silver oxide particles, and the dispersant is in a range of 99.0% to 100% by weight, wherein the silver particles are in flake form having a thickness greater than or equal to 0.1 μm and not greater than 5.0 μm, and a ratio by weight of the silver particles to the silver oxide particles is greater than or equal to 80/20 and not greater than 95/5, and wherein the silver particles in flake form have an aspect ratio of greater than 2 and not greater than 200.

2. The electrically conductive bonding material according to claim 1, wherein the silver particles and the silver oxide particles have a particle size of not smaller than 0.1 μm and not greater than 100 μm.

3. The electrically conductive bonding material according to claim 1, wherein at least one of the silver particles and the silver oxide particles are coated with the dispersant.

4. The electrically conductive bonding material according to claim 1, wherein the amount of the silver oxide particles is not more than the amount of the dispersant.

5. A semiconductor device bonded with the electrically conductive bonding material according to claim 1, a bonding portion comprising a metal part alone with a porosity of higher than 0.1% and lower than 90%.

6. The electrically conductive bonding material according to claim 1, wherein the silver particles in flake form have a thickness not greater than 2.0 μm.

7. The electrically conductive bonding material according to claim 1, wherein the silver particles in flake form have a thickness not greater than 1.0 μm.

8. An electrically conductive bonding material comprising: silver particles, silver oxides particles, a dispersant comprising an organic material containing not more than 30 carbon atoms, and an organic solvent having a boiling point of not higher than 350° C. as essential components; wherein the silver particles are in flake form having a thickness greater than or equal to 0.1 μm and not greater than 5.0 μm; a total amount of the silver particles, the silver oxide particles, the dispersant, and the organic solvent is 100 mass parts and an amount of the organic solvent is not more than 90 mass parts; a ratio by weight of the silver particles to the silver oxide particles is greater than or equal to 80/20 and not greater than 95/5; a total amount of the silver particles, the silver oxide particles, the dispersant, and the organic solvent is in a range of 99.0% to 100% by weight in paste form, and wherein the silver particles in flake form have an aspect ratio of greater than 2 and not greater than 200.

9. The electrically conductive bonding material according to claim 8, wherein the silver particles in flake form have a thickness not greater than 2.0 μm.

10. The electrically conductive bonding material according to claim 8, wherein the silver particles in flake form have a thickness not greater than 1.0 μm.

11. An electrically conductive bonding material comprising:

silver particles, silver oxides particles, a dispersant comprising an organic material containing not more than 30 carbon atoms, and metal particles of other than silver as essential components; wherein the silver particles are in flake form having a thickness greater than or equal to 0.1 μm and not greater than 5.0 μm; a ratio by weight of the silver particles to the silver oxide particles is greater than or equal to 80/20 and not greater than 95/5; a total amount of the silver particles, the silver oxide particles, the dispersant, and the metal particles of other than silver is 99.0% to 100% by weight, and wherein the silver particles in flake form have an aspect ratio of greater than 2 and not greater than 200.

12. The electrically conductive bonding material according to claim 11, wherein the silver particles in flake form have a thickness not greater than 2.0 μm.

13. The electrically conductive bonding material according to claim 11, wherein the silver particles in flake form have a thickness not greater than 1.0 μm.

14. An electrically conductive bonding material comprising: silver particles, silver oxides particles, a dispersant comprising an organic material containing not more than 30 carbon atoms, an organic solvent having a boiling point of not higher than 350° C., and metal particles of other than silver as essential components; wherein the silver particles are in flake form having a thickness greater than or equal to 0.1 μm and not greater than 5.0 μm; a total amount of the silver particles, the silver oxide particles, the dispersant, the organic solvent, and the metal particles is 100 mass parts and an amount of the organic solvent is not more than 90 mass parts; a ratio by weight of the silver particles to the silver oxide particles is greater than or equal to 80/20 and not greater than 95/5; and a total amount of the silver particles, the silver oxide particles, the dispersant, the organic solvent, and the metal particles of other than silver is in a range of 99.0% to 100% by weight in paste form, and wherein the silver particles in flake form have an aspect ratio of greater than 2 and not greater than 200.

15. The electrically conductive bonding material according to claim 14, wherein the silver particles in flake form have a thickness not greater than 2.0 μm.

16. The electrically conductive bonding material according to claim 14, wherein the silver particles in flake form have a thickness not greater than 1.0 μm.

* * * * *